US008585252B2

(12) United States Patent
Wanninger et al.

(10) Patent No.: US 8,585,252 B2
(45) Date of Patent: Nov. 19, 2013

(54) LIGHTING ASSEMBLY

(75) Inventors: Mario Wanninger, Harting/Regensburg (DE); Markus Zeiler, Undorf-Nittendorf (DE); Hubert Ott, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1076 days.

(21) Appl. No.: 12/375,530

(22) PCT Filed: Jul. 27, 2007

(86) PCT No.: PCT/DE2007/001348
§ 371 (c)(1),
(2), (4) Date: Sep. 9, 2009

(87) PCT Pub. No.: WO2008/014771
PCT Pub. Date: Feb. 7, 2008

(65) Prior Publication Data
US 2010/0073907 A1 Mar. 25, 2010

(30) Foreign Application Priority Data
Jul. 31, 2006 (DE) .................. 10 2006 035 635

(51) Int. Cl.
*F21V 3/00* (2006.01)
*F21V 5/00* (2006.01)

(52) U.S. Cl.
USPC ............ 362/311.02; 362/308; 362/311.09; 257/98; 257/99

(58) Field of Classification Search
USPC ............ 257/98, 99; 362/308, 309, 311.02, 362/311.09, 311.1, 311.03, 311.05
See application file for complete search history.

(56) References Cited

U.S. PATENT DOCUMENTS

| 4,907,044 | A | 3/1990 | Schellhorn et al. |
| 5,656,823 | A * | 8/1997 | Kruangam ............. 257/98 |
| 6,340,824 | B1 * | 1/2002 | Komoto et al. ........ 257/99 |
| 6,820,991 | B2 * | 11/2004 | Wakaki et al. ........ 362/27 |
| 7,268,957 | B2 | 9/2007 | Frenzel et al. |
| 7,709,851 | B2 | 5/2010 | Bader et al. |
| 2004/0075100 | A1 | 4/2004 | Bogner et al. |
| 2005/0243577 | A1 | 11/2005 | Moon |

(Continued)

FOREIGN PATENT DOCUMENTS

| CN | 1340864 | 3/2002 |
| CN | 1755959 | 4/2006 |

(Continued)

OTHER PUBLICATIONS

Osram Opto Semiconductors, "Red Emitter Lead (Pb) Free Product—RoHS Compliant", Datasheet, SHF 4273; pp. 1-9, Feb. 23, 2005.

(Continued)

*Primary Examiner* — Stephen F Husar
(74) *Attorney, Agent, or Firm* — Cozen O'Connor

(57) ABSTRACT

A lighting arrangement comprises an optical apparatus (4) with a radiation outlet surface (41) and an optoelectronic component (2) for producing radiation, with an element (3) which is formed like a reflector being formed. The shape and arrangement of the element are suitable for deflecting radiation generated in the component through the radiation outlet surface, and the element is designed to specifically absorb this radiation. The lighting arrangement is preferably intended for particularly homogeneous back-lighting of display apparatuses such as liquid crystal displays (LCDs).

26 Claims, 5 Drawing Sheets

(56) References Cited

U.S. PATENT DOCUMENTS

| | | |
|---|---|---|
| 2006/0065901 A1 | 3/2006 | Aoyagi et al. |
| 2006/0066218 A1 | 3/2006 | Yamaguchi et al. |
| 2006/0082297 A1 | 4/2006 | Camp |
| 2006/0138440 A1 | 6/2006 | Jyo |
| 2011/0242820 A1 | 10/2011 | Yoon et al. |

FOREIGN PATENT DOCUMENTS

| | | |
|---|---|---|
| DE | 197 38 972 | 2/1999 |
| DE | 103 44 768 | 8/2005 |
| EP | 1 134 601 | 1/2001 |
| EP | 1 220 324 | 11/2001 |
| EP | 1 227 458 | 7/2002 |
| EP | 1 653 254 | 5/2006 |
| JP | 63-178569 | 7/1988 |
| JP | 01-258481 | 10/1989 |
| JP | 02-306289 | 12/1990 |
| JP | 2001-339100 | 12/2001 |
| JP | 2006-100500 | 4/2006 |
| JP | 2006-114863 | 4/2006 |
| WO | WO 02/084749 | 10/2002 |
| WO | WO 2005/101531 | 10/2005 |

OTHER PUBLICATIONS

I. Schnitzer et al., "30% external quantum efficiency from surface textured, thin-film ligh-emitting diodes", Appl. Phys. Lett. 63, vol. 16, pp. 2174-2178, Oct. 18, 1993.

M. Zeiler et al., "44.5L: Late-News Paper: Optimization Parameters for LED Backlighting Solutions", 2006 SID International Symposium, Society for Information Display, vol. XXXVII, pp. 1524-1527, Jun. 2006.

* cited by examiner

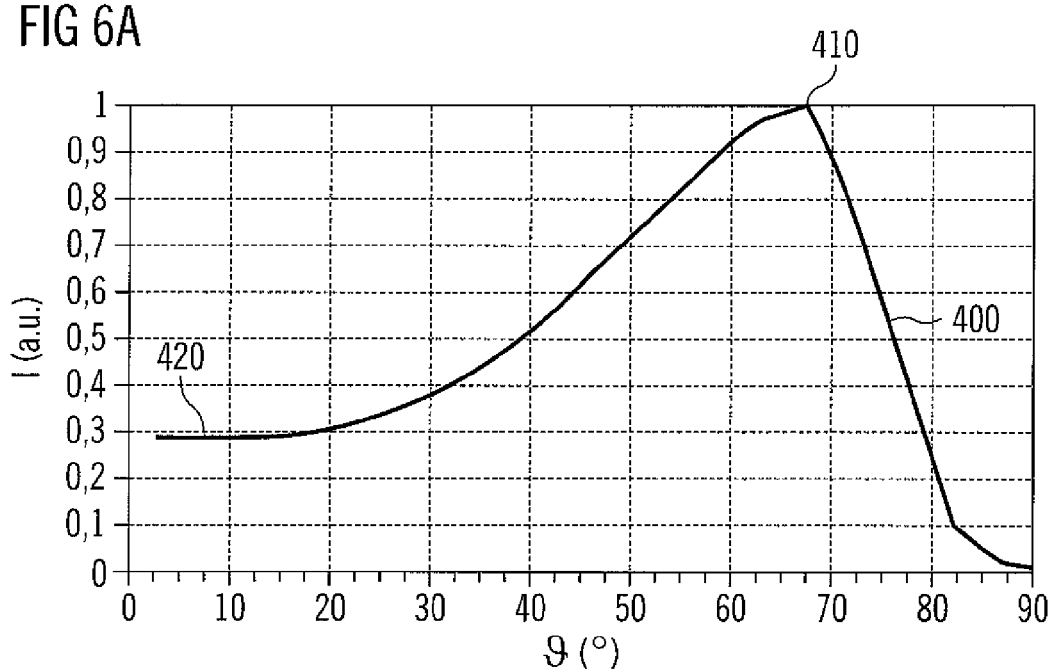
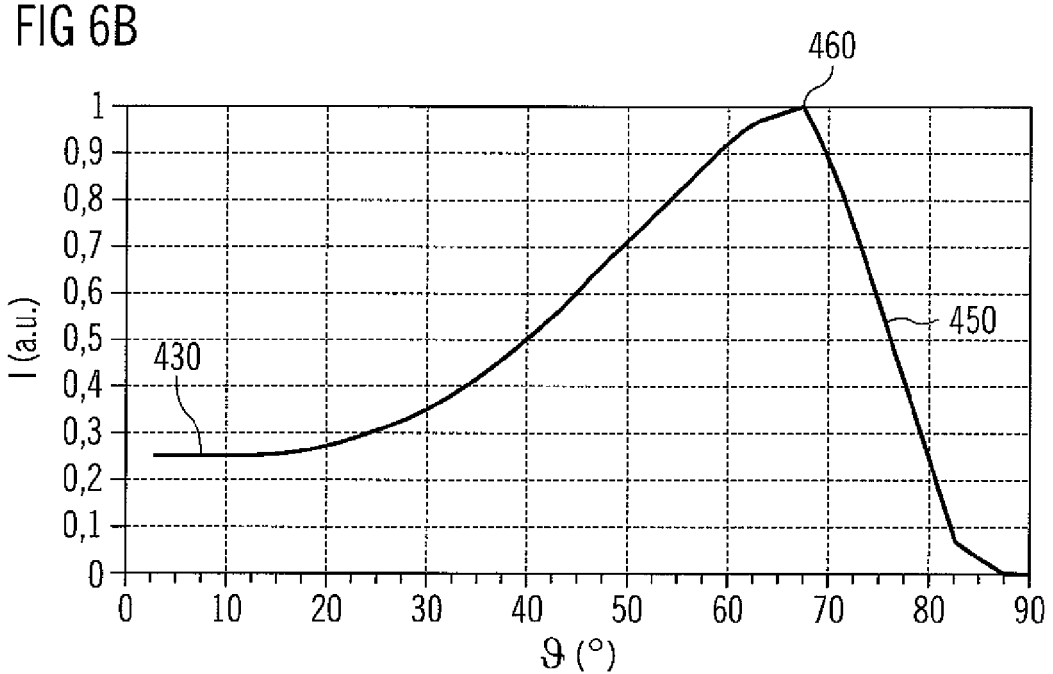

LIGHTING ASSEMBLY

RELATED APPLICATIONS

This is a U.S. national stage under 35 USC §371 of application No. PCT/DE2007/001348, filed on Jul. 27, 2007.

This application claims the priority of German Patent Application No. 10 2006 035 635.7 filed Jul. 31, 2006, the entire content of which is hereby incorporated by reference.

FIELD OF THE INVENTION

The invention relates to a lighting arrangement having an optoelectronic component as a radiation source.

BACKGROUND OF THE INVENTION

Lighting arrangements such as LEDs, which are intended for back-lighting of display apparatuses, are frequently subject to the problem that the display apparatus is not illuminated sufficiently homogeneously. For example, subareas which are illuminated particularly strongly can have a disturbing effect when viewing the display apparatus.

SUMMARY OF THE INVENTION

An object of the present invention is to provide a lighting arrangement whose emitted radiation is shaped or can be shaped in a simplified manner and reliably, according to a predetermined emission characteristic.

In a first embodiment, a lighting arrangement according to the invention comprises an optical apparatus with a radiation outlet surface and an optoelectronic component for producing radiation, with an element which is formed like a reflector being formed, whose shape and arrangement are suitable for deflecting radiation generated in the component through the radiation outlet surface, and with the element being designed to specifically absorb radiation which is generated in the component.

During operation of the lighting arrangement, the radiation which emerges through the radiation outlet surface is predominantly that which is generated in the optoelectronic component and strikes the optical apparatus without previously being reflected in the lighting arrangement, in particular on the element which is formed like a reflector. Radiation which would emerge through the radiation outlet surface after reflection on the element which is formed like a reflector is in contrast predominantly absorbed, since the element which is formed like a reflector is designed to specifically absorb the radiation which is generated in the optoelectronic component. It is therefore advantageously possible to reduce the radiation component which emerges from the radiation outlet surface after being reflected one or more times in the lighting arrangement, and thus emerges at an angle which can be controlled only with difficulty. The total radiation emerging from the radiation outlet surface can therefore be shaped in a simplified manner according to a predetermined emission characteristic.

The optical apparatus is preferably a separate component from the optoelectronic component.

In a preferred refinement, the optoelectronic component contains at least one semiconductor chip which is suitable for radiation generation. The semiconductor chip has a surface which faces the optical apparatus, and a side surface. Radiation which is generated in the semiconductor chip can emerge through these surfaces.

The element which is formed like a reflector is preferably designed and arranged relative to the semiconductor chip such that the majority of the radiation which emerges from the side surface of the semiconductor chip strikes the element which is formed like a reflector, and is specifically absorbed by it. This avoids radiation which is output from the semiconductor chip striking the radiation outlet surface not directly but only after being reflected one or more times within the lighting arrangement. The optical apparatus is therefore provided primarily with radiation which emerges through the surface of the semiconductor chip. This radiation which emerges from the surface is not reflected before striking the radiation outlet surface and can be shaped by the optical apparatus in a simplified manner, according to a predetermined emission characteristic.

The total radiation power which emerges from the radiation outlet surface of the optical apparatus is reduced by the proportion of the radiation power which is generated by the optoelectronic component and is absorbed by the element which is formed like a reflector and is designed to be specifically absorbent. This relates in particular to the radiation emerging from the side surface of the semiconductor chip. However, if it were not absorbed, but were passed to the optical apparatus, this radiation component could be shaped by said optical apparatus only with difficulty according to the predetermined emission characteristic. This is particularly true if the optical apparatus is designed and is arranged to be suitable for beamshaping of the radiation which emerges from the surface, which generally has a small area. For an optical apparatus such as this, radiation which strikes after reflection has an undesirable scattered radiation component. This scattered radiation component can be reduced by the specifically absorbent form of the element which is formed like a reflector. The radiation which emerges from the lighting arrangement and is preferably in the visible spectral range can in consequence be shaped in a simplified manner according to an emission characteristic which is predetermined for the lighting arrangement, and in particular is directional.

According to a further preferred refinement, the semiconductor chip is a thin-film semiconductor chip, with that surface of the semiconductor chip which faces the optical apparatus being embodied as a main radiation output surface, and with the side surface forming a secondary radiation outlet surface. The radiation power which emerges from the main radiation output surface is in this case greater than the radiation power which emerges from the secondary radiation outlet surface. The sum of the radiation power which emerges from the secondary radiation outlet surfaces is preferably less than the radiation power which emerges through the main radiation output surface.

In a further embodiment, a lighting arrangement according to the invention comprises an optoelectronic component having at least one semiconductor chip which is intended for radiation production, is a formed as a thin-film semiconductor chip, and has a surface which is embodied as a main radiation output surface and a side surface which forms a secondary radiation outlet surface, with an element which is formed like a reflector being formed, whose shape and arrangement are suitable for deflecting at least a part of the radiation which emerges from the secondary radiation outlet surface, and with the element being designed to specifically absorb radiation which is emitted from the semiconductor chip.

A lighting arrangement designed in this way provides radiation which is generated by the thin-film semiconductor chip and the majority of which emerges from the main radiation output surface. The majority of the radiation which emerges from the side surfaces is in contrast predominantly absorbed by the element which is formed like a reflector and is designed to be specifically absorbent. The radiation which strikes a separate downstream optics is thus emitted from a precisely defined surface, the main radiation output surface of the thin-film semiconductor chip, and can be shaped in a simplified manner according to a predetermined emission characteristic.

In a preferred refinement, the lighting arrangement comprises an optical apparatus having a radiation outlet surface through which radiation which is generated by the thin-film semiconductor chip can emerge from the lighting arrangement.

A thin-film semiconductor chip comprises a carrier and a semiconductor body with a semiconductor layer sequence, with the semiconductor body being arranged on the carrier. In contrast to a conventional semiconductor chip, in the case of a thin-film semiconductor chip, the carrier is different from a growth substrate on which the semiconductor layer sequence is deposited, for example by means of epitaxy. The growth substrate can be removed or thinned in places or completely. By way of example, this can be done mechanically or chemically. The carrier is used to make the semiconductor body mechanically robust. The growth substrate is no longer required for this purpose.

In contrast to the growth substrate, the carrier advantageously need not comply with the stringent requirements for crystalline purity but can, in fact, be selected on the basis of other criteria, such as mechanical robustness, optical, thermal or electrical characteristics.

In a preferred refinement, a mirror layer is arranged on the semiconductor body. The mirror layer is preferably arranged between the carrier and the semiconductor body. Furthermore, the mirror layer preferably contains a metal or a metallic alloy, or is designed to be metallic. By way of example, the mirror layer may contain Au, Al, Ag, Pd, Rh or Pt or an alloy with at least one of these materials. For example, Au is distinguished by high reflectivity in the red or infrared spectral range, while Ag or Al exhibits high reflectivity in the blue or ultraviolet spectral range, as well.

Radiation which is generated in the active area and runs in the direction of the carrier can be reflected on the mirror layer and can be emitted on a surface of the semiconductor chip which faces away from the carrier and forms the main radiation output surface, thus advantageously increasing the radiation component which is emitted through the main radiation output surface. Furthermore, the mirror layer can prevent radiation from being absorbed by the carrier material, thus further increasing the degrees of freedom for choice of the carrier material.

In thin-film semiconductor chips, the radiation power which emerges from the side secondary radiation outlet surfaces is decreased in favour of more radiation power being output from the main radiation output surface. Since the lighting arrangement preferably essentially provides only the radiation which emerges from the surface of the semiconductor chip, while the radiation which emerges from the side surface is predominantly absorbed by the element which is formed like a reflector and is designed to be specifically absorbent, the use of a thin-film semiconductor chip as a radiation source advantageously increases the radiation power which is emitted from the lighting arrangement. Thin-film semiconductor chips are therefore particularly suitable for use as a radiation source.

The element which is formed like a reflector may be considered to be an element in the lighting arrangement or an element which is integrated in the optoelectronic component, whose shape and arrangement relative to the optoelectronic component, in particular if appropriative relative to its semiconductor chip, and/or relative to the optical apparatus, is suitable for deflection of radiation which is emitted from the optoelectronic component and strikes the element, at least partially, directly or indirectly through the radiation outlet surface. The shape of the element which is formed like a reflector can be chosen freely within wide limits provided that, on the basis of its shape and arrangement, at least a part of the radiation which is generated in the optoelectronic component could be deflected by this element through the radiation outlet surface, and in particular would be deflected to a greater extent if the specifically absorbing design were dispensed with. For example, the element which is formed like a reflector may be in the form of a flat or a curved surface.

The element which is formed like a reflector is regarded as being specifically absorbent if the reflectivity of the element which is formed like a reflector is 49% or less, in particular 30% or less, preferably 15% or less, and particularly preferably 5% or less, for radiation which is generated in the optoelectronic component. A value which is low as possible for the reflectivity of the element which is formed like a reflector is advantageous since this reduces the component of radiation which is reflected on the element which is formed like a reflector. In fact, the radiation is absorbed to a corresponding extent. The element which is formed like a reflector and is designed to be absorbent is typically designed such that radiation which is generated by the optoelectronic component is not transmitted through this element. The absorption degree A of the element which is formed like a reflector and is designed to be specifically absorbent, and the reflectivity R, which is also referred to as the reflection degree, are therefore linked to one another by the relationship $A=1-R$.

An element which is obviously in the form of a reflector with residual absorption which cannot be avoided or can be avoided only with great effort should not be regarded as being designed to be specifically absorbent, in the above sense. This relates not only to directionally reflective elements, in general such as metallic elements or elements with a metal surface, but also to diffusively reflective elements, such as white plastic mouldings, which are typically used for a housing body for optoelectronic components, such as light-emitting diodes.

In a preferred refinement, the element which is formed like a reflector is manufactured entirely or at least in places from a material which absorbs radiation that is generated in the optoelectronic component, or from an absorbent material composition, or is provided entirely or in places with a material which absorbs the radiation that is generated in the optoelectronic component, or with an absorbent material composition, for example by being coated, printed or stamped.

In a particularly preferred refinement, the element which is formed like a reflector is manufactured completely or partially from black, dark-grey or blackened material or a black, dark-grey or blackened material composition. Alternatively or additionally, the element which is formed like a reflector can be provided, for example coated, with black or dark-grey material or with a black or dark-grey material composition. In particular, the element may be manufactured completely or partially from plastic, with this plastic being blackened for example by dyes, or soot-like or soot-similar particles. In the visible spectral range, a material or a material composition is regarded as being black if the material is designed to be sufficiently greatly absorbent consistently over this spectral range to be perceived as black. In particular, a blackened material means a material which is perceived as grey or dark grey.

According to a further preferred refinement, the optoelectronic component comprises a housing body which preferably contains the element which is formed like a reflector. Furthermore, the optoelectronic component preferably comprises an external connecting conductor on which the semiconductor chip is mounted and, in particular, makes electrical contact. The semiconductor chip is typically electrically conductively connected to a second external connecting conductor.

In particular, the electrical connecting parts can be surrounded by the housing body. The optoelectronic component may be formed in the so-called premoulded housing form, in which the housing body is prefabricated. The semiconductor chip in this refinement can be mounted on an electrical connecting conductor which is already surrounded by the housing body. The external connecting conductors, which may be formed by means of a leadframe allow external electrical contact to be made with the semiconductor chip and may be electrically conductively connected to conductor tracks on a connecting mount, for example a printed circuit board. The electrical connection is preferably made by soldering, in particular lead-free soldering.

In a preferred refinement, the optoelectronic component comprises a thermal connecting part which is used to make thermal contact with the optoelectronic component. This thermal connecting part is preferably formed in addition to the electrical connecting conductor. The heat which is generated during operation of the optoelectronic component can advantageously be dissipated, largely independently of the electrical connections, by means of a thermally conductive connection of this thermal connecting part to an external heat sink.

In a further preferred refinement, the element which is formed like a reflector is formed by means of a wall of a cavity in the housing body. The semiconductor chip is particularly preferably arranged in the cavity. An arrangement such as this allows the semiconductor chip to be protected in a simpler manner against external mechanical influences. Furthermore, the absorbent form of the element which is formed like a reflector allows the majority of the radiation which is output from the semiconductor chip and which would strike the radiation outlet surface only as a consequence of reflection, to be predominantly absorbed. Single and multiple reflections of radiation within the lighting arrangement, with this scattered radiation subsequently emerging from the lighting arrangement at an angle which can be controlled only with difficulty, are in this way advantageously reduced.

In a further preferred refinement, the housing body contains a ceramic or a plastic, or is partially or completely manufactured from a ceramic or a plastic. Ceramic is normally distinguished by good thermal conductivity, so that the heat which is produced during operation of the optoelectronic component can be dissipated efficiently. Housing bodies based on plastics can be manufactured at particularly low cost.

In a further preferred refinement, the housing body, in particular the element which is formed like a reflector, is manufactured completely or partially from a material which specifically absorbs the radiation which is generated in the optoelectronic component. Alternatively or additionally, the housing body, in particular that wall of the cavity of the housing body which forms the element which is formed like a reflector, can be completely or partially black, blackened or suitably coated. For example, soot-like or soot-similar particles or dyes can be used in order to colour plastic black or dark grey.

In a further preferred refinement, the semiconductor chip is embedded in a sheath, which in particular is transmissive to the radiation which is generated in the semiconductor chip. This sheath can cover the semiconductor chip, in particular completely. An electrical contact for the semiconductor chip, for example a bonding wire, can also be covered by the sheath. The sheath is preferably designed to be sufficiently dimensionally stable to allow it to protect the chip, and if appropriate the bonding wire, against damaging external influences, for example mechanical loading. For example, the sheath may contain a reaction resin, a silicone resin or a silicone.

In a further preferred refinement, an intermediate layer is formed between the sheath and the optical apparatus and is particularly preferably directly adjacent to the optical apparatus and to the sheath. The intermediate layer is preferably used as a refractive-index matching layer between the sheath and the optical apparatus.

In a preferred refinement, the optical apparatus has an optical axis which preferably runs through the semiconductor chip, in particular essentially through the centre of the semiconductor chip, for example the centre of gravity of a laterally running cross-sectional area of the semiconductor chip.

In a further preferred refinement, the optical apparatus has a radiation inlet surface which faces the optoelectronic component. The radiation inlet surface expediently faces that surface of the semiconductor chip which is used to emit radiation. The minimum distance between the semiconductor chip and the radiation inlet surface is preferably 3 mm or less, particularly preferably 1 mm or less, for example 0.6 mm.

The minimum distance between the radiation outlet surface of the optical apparatus and the surface of the semiconductor chip is preferably 5 mm or less, preferably 3 mm or less, for example 2 mm. The reduction in the scattered radiation allows reliable beamshaping by means of the optical apparatus with very short distances between the optical apparatus and the semiconductor chip. The lighting arrangement can therefore be manufactured to be particularly compact.

In a preferred refinement, the radiation outlet surface is rotationally symmetrical with respect to the optical axis. An emission characteristic which is essentially rotationally symmetrical with respect to the optical axis can be achieved in this manner. Parts of the optical apparatus which are not used mainly for beamshaping but, for example, are provided for mounting the optical apparatus on the optoelectronic component, can be designed such that they are not rotationally symmetrical with respect to the optical axis.

In a preferred refinement, the radiation outlet surface of the optical apparatus has a concave-curved subarea and a convex-curved subarea which at least partially surrounds the concave-curved subarea. The optical axis preferably passes through the concave-curved subarea and particularly preferably at the same time through the semiconductor chip, in particular essentially through its centre, for example the centre of gravity of a laterally running cross-sectional area of the semiconductor chip. Radiation which is generated in the optoelectronic component and directly strikes the concave-curved subarea in a manner which is not coincident with the optical axis is predominantly deflected away from the optical axis.

This reduces the proportion of the radiation which propagates essentially in the direction of the optical axis, for example at an angle of 20° or less with respect to the optical axis. In contrast, the radiation component which leaves the lighting arrangement at large angles with respect to the optical axis, for example 30° or more, is increased. The radiation power which is emitted from the lighting arrangement preferably has, as a function of the angle with respect to the optical axis, a maximum at comparatively large angles of 30° or more, for example at an angle between 60° and 70°, inclusive.

A lighting arrangement having an emission characteristic such as this is particularly suitable for illumination of a surface which extends essentially at right angles to the optical axis of the lighting arrangement, and in particular for back-lighting of display apparatuses, for example LCDs (liquid crystal displays). The area to be illuminated is typically considerably larger than the area of the semiconductor chip. An emission characteristic with a maximum of the emitted radiation power at a large angle with respect to the optical axis, preferably at an angle of 60° or more, is advantageous since this allows areas of the surface which is to be illuminated at a correspondingly long distance from the optical axis to be illuminated even when the distances between the surface and the lighting arrangement are short. For example, the back-lighting unit of an LCD can thus advantageously be manufactured to be particularly compact, with a shallow physical depth.

The convex-curved subarea preferably has a first subregion and a second subregion, with the curvature of the first subregion being less than the curvature of the second subregion. In this case, the second subregion may be arranged at a greater distance from the optical axis than the first subregion. The curvature of the convex-curved subarea, in particular the curvature of the second subregion, preferably increases as the distance from the concave-curved subarea increases. Curvature which increases continuously with the distance is preferable, but not essential. An increase in the curvature can result in the component of radiation which emerges at a large angle with respect to the optical axis advantageously being increased. Uniform illumination of subareas of the area to be illuminated which are located at a comparatively long distance from the optical axis is therefore assisted.

Radiation which emerges from the surface in the semiconductor chip and strikes the radiation outlet surface directly is deflected by the latter particularly efficiently at a large angle of 30° or more with respect to the optical axis. In contrast, scattered radiation would be passed predominantly in the direction of the optical axis and would in consequence lead to stronger illumination of the area to be illuminated, in the area of its intersection with the optical axis. The specifically absorbent form of the element which is formed like a reflector allows for this scattered radiation component to be reduced. An area to be illuminated can thus be illuminated with little scattered radiation, over a large area and particularly homogeneously. In particular, it is advantageously possible to reduce the formation of more strongly illuminated areas which extend like islands around the intersection of the area with the optical axis.

Furthermore, radiation which strikes the radiation outlet surface from outside the lighting arrangement and passes through the optical apparatus can also cause a scattered radiation component if this radiation is reflected in the component and emerges again through the radiation outlet surface of the optical apparatus. This component of the radiation which emerges again is also referred to as phantom light and can reduce the contrast ratio of the display apparatus when using the lighting arrangement for back-lighting of display apparatuses, such as LCDs or LCD televisions. By means of the specifically absorbent form of the element which is formed like a reflector, and in particular of the entire housing body, the phantom light influence can be largely suppressed, and this can lead to an advantageous increase in the contrast ratio of the display apparatus.

In a preferred refinement, the optical apparatus is attached to the optoelectronic component. For this purpose, the optical apparatus may, for example, be in the form of attachment optics, in particular optics which are placed on, optics which are plugged on or optics which are snapped on. Alternatively or additionally, the optical apparatus can be adhesively bonded to the optoelectronic component.

In this case, plug-on optics means an optical apparatus which has an attachment element which can be plugged into a suitable mounting apparatus for the optoelectronic component, for example a recess in the housing body. In addition, the attachment elements can be hot swaged to the optoelectronic component after the optical apparatus has been fitted, as a result of which the optical apparatus is attached particularly robustly and permanently to the optoelectronic component.

In the case of snap-on optics, the optical apparatus has an attachment element which latches into a suitable mounting apparatus for the optoelectronic component.

Optics which are placed on can be attached to the optoelectronic component without engagement and/or without any latching connection. Specific elements are not required for attachment to the optoelectronic component in the case of optics which are placed on. In addition, the optics which are placed on can be adhesively bonded to the optoelectronic component.

The lighting arrangement and in particular the optoelectronic component preferably have no diffusers and/or luminescence converters since both scattering of radiation generated in the optoelectronic component on diffusers as well as absorption of the radiation followed by re-emission by luminescence converters would lead to the emission from the optoelectronic component being increasingly nondirectional. Furthermore, the sheath and if appropriate the intermediate layer are preferably clear. This allows the radiation which is provided by the optoelectronic component to be shaped by the optical apparatus in a simplified manner, according to a predetermined emission characteristic.

In a further preferred refinement, the optoelectronic component is a surface mountable device (SMD).

The lighting arrangement is particularly preferably formed with the optoelectronic component and the optical apparatus attached to the optoelectronic component as a composite component. As a composite component, the lighting arrangement can be fitted more easily as an entity, for example on a printed circuit board. The composite component is preferably in the form of a surface mountable device.

BRIEF DESCRIPTION OF THE DRAWINGS

Further features, advantageous refinements and expedient features of the invention will become evident from the following description of the exemplary embodiments, in conjunction with the figures, in which:

FIG. 6A shows an example of the emission characteristic (relative intensity I as a function of the angle θ with respect to the optical axis) of a lighting arrangement having an element which is formed like a reflector and is designed not to be specifically absorbent, FIG. 6B shows an example of the emission characteristic (relative intensity I as a function of the angle θ with respect to the optical axis) of a lighting arrangement according to the invention with an element which is formed like a reflector and is designed to be specifically absorbent.

DETAILED DESCRIPTION OF THE DRAWINGS

Identical elements, elements of the same type and elements having the same effect are provided with the same reference symbols in the figures.

Figure 1:
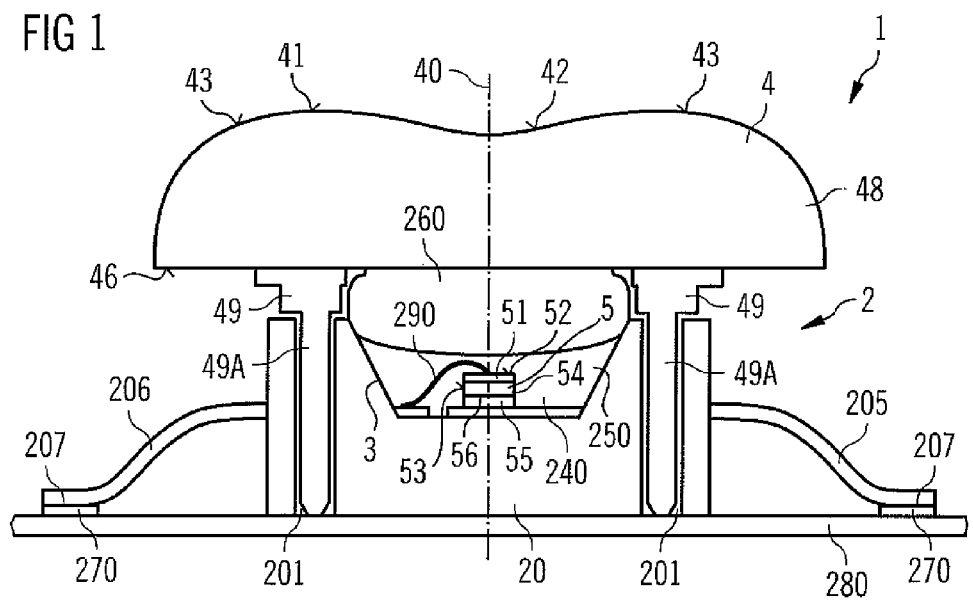
FIG. 1 shows a schematic section view of a first exemplary embodiment of a lighting arrangement according to the invention.
Figure 2:
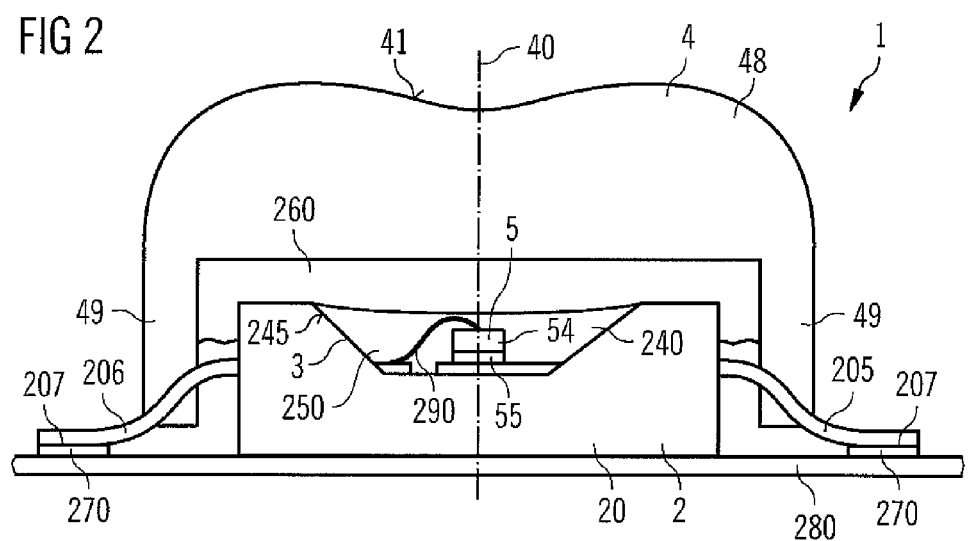
FIG. 2 shows a schematic section view of a second exemplary embodiment of a lighting arrangement according to the invention.

FIGS. 1 and 2 show two exemplary embodiments of a lighting arrangement 1 according to the invention. The lighting arrangement in each case comprises an optical apparatus 4, an optoelectronic component 2 and an element 3 which is formed like a reflector and is designed to be specifically absorbent. Radiation which is generated by the optoelectronic component 2 emerges from the lighting arrangement through a radiation outlet surface 41 of the optical apparatus.

Furthermore, the optoelectronic component contains a semiconductor chip 5 which is provided for radiation production and is preferably a thin-film semiconductor chip. A typical configuration of a thin-film semiconductor chip will be described in more detail in conjunction with FIG. 4.

The optoelectronic component 2 comprises the element 3 which is formed like a reflector. The optoelectronic component 2 also contains a housing body 20. The element 3 which is formed like a reflector is formed by a wall 245 of a cavity 240 of the housing body. The semiconductor chip 5 is arranged in the cavity 240 in the housing body 20.

The housing body 20 may contain a ceramic or may be produced completely or partially from a ceramic. Ceramic is typically distinguished by high thermal conductivity, as a result of which heat which is generated during operation of the optoelectronic component can be dissipated efficiently via the housing body. Alternatively, the housing body can be manufactured from plastic, for example using an injection-moulding, transfer moulding or pressure-casting process. Housing bodies composed of plastic can be produced at particularly low cost. Furthermore, the same moulds can be used as for the production of light-emitting diodes, in which the housing bodies are made as highly reflective as possible in order to maximise the radiation power which is emitted from the light-emitting diode. There is advantageously no need for costly moulds to be newly produced.

The element 3, which is formed like a reflector, is designed to be specifically absorbent for the radiation which is generated in the optoelectronic component. For this purpose, the element 3 which is formed like a reflector and, furthermore, the housing body 20 can be manufactured completely or partially from a material which absorbs the radiation which is generated in the optoelectronic component, or from an absorbent material composition. The element which is formed like a reflector and in particular the housing body are preferably black or dark grey. For example, a housing body composed of plastic can be made black or dark grey by the addition of dyes, or soot-like or soot-similar particles to the plastic compound that is used.

Alternatively or additionally, the element 3 which is formed like a reflector, and in particular the housing body 20, may be provided, for example coated, for instance printed or stamped, with a material which absorbs the radiation generated in the optoelectronic component or with an absorbent material composition.

In particular, the remaining reflectivity of the element 3 which is formed like a reflector and is designed to be specifically absorbent is, in the wavelength range of the radiation which is emitted by the optoelectronic component, 49% or less, preferably 30% or less, preferably 15% or less, particularly preferably 5% or less.

Furthermore, the semiconductor chip 5 is mounted on a first electrical connecting conductor 205, which preferably allows an electrically conductive connection to an external connection, for example a conductor track. A second electrical connecting conductor 206 may, for example, be electrically connected via a bonding wire 290 to the upper face 52, facing away from the electrical connecting conductor, of the semiconductor chip. The ends 207 of the first connecting conductor 205 and of the second connecting conductor 206 can be attached to a printed circuit board 280 by means of a solder 270, in particular a lead-free solder.

The first electrical connecting conductor 205 and the second electrical connecting conductor 206 are surrounded by the housing body 20 and project from different faces of the housing body. The first and the second electrical connecting conductors are preferably formed by a leadframe for the optoelectronic component 2.

Furthermore, the optoelectronic component 2 is embodied as a surface mountable device. The lighting arrangement 1 can be formed with the optoelectronic component 2 and the optical apparatus 4 as a composite component.

In comparison to individual mounting of the optoelectronic component and the optical apparatus, a lighting arrangement which is in the form of a surface mountable composite device can be mounted more easily on the printed circuit board 280.

The cavity 240 in the housing body contains a sheathing compound 250, in which the semiconductor chip 5 and the bonding wire are embedded. In this case, it is advantageous for them to be embedded completely. This sheath is used to protect the semiconductor chip 5 and the bonding wire against damaging external influences and mechanical loads. The sheathing compound is expediently designed to be transmissive to the radiation that is generated by the semiconductor chip.

Furthermore, an intermediate layer 260 is introduced between the sheathing compound 250 and a radiation inlet surface 46 of the optical apparatus 4, which is particularly preferably directly adjacent to the sheathing compound and to the radiation inlet surface. This intermediate layer can be used for refractive-index matching between the sheath and the optical apparatus.

The optoelectronic component, the intermediate layer and the sheath are preferably assigned to be essentially free of diffusers and/or luminescence converters. A more non-directional emission can be avoided, as a result of which the radiation which is provided by the optoelectronic component can be shaped by the optical apparatus more easily, according to a predetermined emission characteristic.

An optical axis 40 of the optical apparatus 4 runs through the semiconductor chip 5, and particularly essentially through the centre of the semiconductor chip. The optical axis is preferably at right angles or essentially at right angles to the surface 52 of the semiconductor chip 5. The optical apparatus comprises a beamshaping part 48 and a mount part 49. The mount part is provided for attaching the optical apparatus to the optoelectronic component.

The beamshaping part 48 and the mount part 49 of the optical apparatus 4 can be manufactured from different materials, and in particular can be integrally formed on one another. If the beamshaping part and the mount part are integrally formed on one another, this makes it easier for the mount part to be mechanically robustly connected to the beamshaping part without use of adhesion promoters. The materials for the mount part and the beamshaping part may be chosen for different requirements. In the case of the beamshaping part, optical characteristics such as transparency and radiation resistance for radiation emitted by the optoelectronic component are particularly important.

The beamshaping part 48 preferably contains a silicone or silicone hybrid material or is composed of a material such as this. In contrast, the mount part 49 is not provided for beamshaping and can therefore also be designed to be opaque to radiation. The material for the mount part can be selected for particular requirements such as mechanical robustness or good attachment characteristics. A thermoplastic or a thermosetting plastic is particularly suitable for manufacturing the mount part.

The distance between the radiation inlet surface 46 of the optical apparatus and the surface of the semiconductor chip 52 is 5 mm or less, preferably 3 mm or less, preferably 1 mm or less, and particularly preferably about 0.6 mm. The lighting arrangement can therefore advantageously be manufactured in a particularly compact form.

Figure 3:
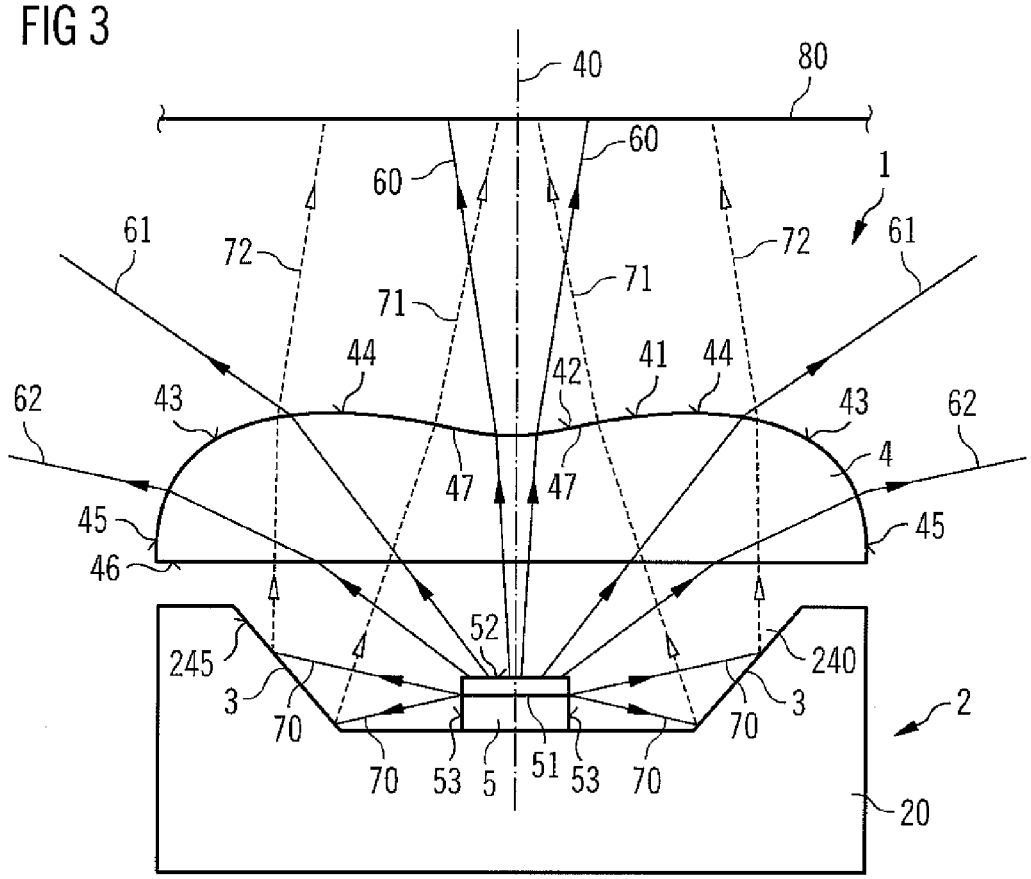
FIG. 3 shows an example of a schematic illustration of the beam profile of a lighting arrangement according to the invention.

While, in the case of the exemplary embodiments shown in FIGS. 1 and 2, the beamshaping part of the optical apparatus is designed in the same way as that described in conjunction with FIG. 3, the two exemplary embodiments differ in the form of the mount part and the type of attachment to the optoelectronic component.

In FIG. 1, the optical apparatus 4 is in the form of plug-on optics. In this case, the mount part 49 may have an attachment element 49A like a pin, which can be plugged into a suitable mounting apparatus of the optoelectronic component 2. The mounting apparatus is preferably formed by a recess or a cut-out 201 in the housing body 20. In addition, the attachment element can be hot-swaged to the optoelectronic component after the optical apparatus has been fitted, thus resulting in the optical apparatus being attached to the optoelectronic component in a robust and permanent manner.

FIG. 2 shows the optical apparatus as optics which are placed on. A mount part 49 surrounds the housing body 20 laterally, in particular completely. In this case, the mount part can clasp an outermost side surface of the housing body. Furthermore, the mount part may be laterally separated from the housing body over a large area. In this case, complete separation is advantageous.

The intermediate layer 260 at least partially fills the volume between the optical apparatus 4 and the housing body 20. The volume between the sheathing compound 250 and the radiation inlet surface 46 is preferably completely filled by the intermediate layer. Furthermore, in the case of optics which are placed on, the intermediate layer preferably clasps the housing body. The intermediate layer may contain or be composed of a silicone, in particular a silicone gel, or a silicone hybrid material. The intermediate layer can therefore at the same time carry out the function of a refractive-index matching layer and can be used for simple, robust and permanent attachment of the optical apparatus 4 to the optoelectronic component 2.

The exemplary embodiments of a lighting arrangement shown in FIGS. 1 and 2 are preferably provided for homogeneous illumination of a surface 80 which runs essentially at right angles to the optical axis 40. Since the area to be illuminated is typically considerably larger than the surface of the semiconductor chip 5, it is necessary for uniform illumination for as large a proportion as possible of the radiation which is generated in the optoelectronic component 2 to leave the radiation outlet surface 41 at a large angle with respect to the optical axis. The maximum of the emitted radiation power as a function of the angle with respect to the optical axis preferably occurs at an angle of greater than or equal to 50°, particularly preferably greater than or equal to 60°, for example about 70°. A possible shape for the beamshaping part 48 of the optical apparatus 4 of a lighting arrangement 1 such as this, and the method of operation of the optical apparatus 4, will be explained with reference to FIG. 3. The design of the illustrated lighting arrangement corresponds in this case to that from FIGS. 1 and 2. For clarity reasons, however, the figure does not show some of the details of the lighting arrangement, which are not critical to the principle of beamshaping by the optical apparatus 4, according to an emission characteristic predetermined for the lighting arrangement, for the radiation which is generated by the semiconductor chip 5 in an active area 51.

The radiation inlet surface 46 is essentially flat. The beamshaping of the radiation which is generated in the optoelectronic component, according to an illumination intensity distribution which is predetermined for the lighting arrangement, preferably predominantly takes place on the radiation outlet surface, thus allowing reliable beamshaping in a simplified manner.

The radiation outlet surface 41 of the optical apparatus is preferably rotationally symmetrical with respect to the optical axis 40 of the optical apparatus 4. Parts of the optical apparatus which are not used for beamshaping, for example the mount part 49 which is shown in FIGS. 1 and 2, may in this case be formed without rotational symmetry.

Furthermore, the radiation outlet surface 41 has a concave-curved subarea 42. The optical axis 40 of the optical apparatus 4 runs through the concave-curved subarea.

The concave-curved subarea 42 is surrounded by a convex-curved subarea 43, in particular completely. The area content of the convex-curved subarea is preferably greater than the area content of the concave-curved subarea. Furthermore, the convex-curved subarea has a first convex-curved subregion 44 and a second convex-curved subregion 45.

The radiation which is generated in the active area 51 of the semiconductor chip 5 emerges through a surface 52 of the semiconductor chip and a side surface 53. The effect of the optical apparatus 4 on the radiation emerging from the surface is illustrated by way of example on the basis of the beams 60, 61 and 62.

For radiation 60 which strikes the concave-curved subarea 42 of the radiation outlet surface 41, the optical apparatus acts like a divergent lens. Radiation which strikes the concave-curved area of the radiation outlet surface obliquely with respect to the optical axis 40 or at a distance other than zero parallel to the optical axis is therefore refracted away from the optical axis. This advantageously reduces the radiation component which strikes the surface 80 to be illuminated in the area close to the optical axis. Radiation 61 and 62 which respectively strikes the first 44 and the second 45 convex-curved subregion is likewise refracted away from the optical axis. The second convex-curved subregion 45 is preferably more sharply curved than the first convex-curved subregion since radiation 62 which strikes the second subregion can therefore be refracted particularly efficiently at a large angle with respect to the optical axis.

The radiation outlet surface 41 is preferably formed without any sharp transitions, that is to say the entire radiation outlet surface is a surface which can be differentiated at any point, in particular at a transition 47 between the concave-curved subarea 42 and the convex-curved subarea 43. Brighter or darker areas caused by sharp transitions, for example rings of higher intensity on the surface to be illuminated, can therefore advantageously be avoided. Furthermore, the beam paths in or on the optical apparatus preferably run essentially without any total internal reflection.

The optical apparatus is preferably also designed such that any two beams which originate from the region of the active area 51 through which the optical axis passes do not cross over after emerging from the radiation outlet surface 41. Beams which cross over may have the effect of local focusing of radiation in such a way that this can result in inhomogeneities in the illumination intensity, for example in the form of rings or circles of relatively high intensity, being formed on the surface 80 to be illuminated for the lighting arrangement. For the case of an ideal point light source which is arranged on the optical axis, such local focusing can thus be completely avoided.

In particular, radiation which is subject to reflection before striking the radiation outlet surface 41 of the optical apparatus 4 can cause beam paths that cross over. This is illustrated by the beams 70 shown in FIG. 3, which emerge through the side surfaces 53 of the semiconductor chip 5.

Arrows with dashed lines 71 and 72 for the beams 70 indicate how the beams would run after reflection on the element which is formed like a reflector if the element 3 which is formed like a reflector were not designed to be specifically absorbent for radiation generated in the semiconductor chip, as described in conjunction with FIG. 1, but, for example, were to result in directional reflection of incident radiation because of a metallic coating, for example. For example, the beams 71 and the beams 70, as well as the beams 72 and the beams 61, would cross after emerging from the radiation outlet surface 41. This could result in areas of increased illumination on the surface to be illuminated, for specific distances between the surface 80 and the radiation outlet surface. The specifically absorbent form of the element which is formed like a reflector reduces the amount of radiation striking the radiation outlet surface after previously having been reflected on the element 3 which is formed like a reflector. The radiation which strikes the optical apparatus is therefore predominantly that which emerges from the semiconductor chip from a precisely defined area of the surface 52 of the semiconductor chip S. In this sense, the radiation which strikes the optical apparatus approximates to the radiation which is emitted from an ideal point light source. Crossing beam profiles can thus largely be avoided, thus allowing particularly homogeneous illumination of the surface 80 to be illuminated.

Furthermore, in the case of directional reflection on the element which is formed like a reflector, neither the beam 71 which would be deflected on the concave-curved subarea 42 of the radiation outlet surface 41 nor the beam 72 which would strike the convex-curved subarea 43 are refracted away from the optical axis but in fact predominantly lead to illumination of the subarea of the surface 80 to be illuminated, close to the optical axis. This central area of the surface would thus be more strongly illuminated. An element which is formed like a reflector and is designed to be diffusely reflective with a high reflection coefficient, for example an element which is formed like a reflector and is formed by a white plastic surface, would cause a scattered light component to an increased extent and in consequence stronger illumination of the surface to be illuminated in the area close to the intersection with the optical axis, for example at a distance of 10 mm or less from the optical axis. Because of the specifically absorbent form of the element which is formed like a reflector, a particularly homogeneous illumination of a surface to be illuminated, for example a display apparatus such as an LCD, can be achieved.

In the case of a lighting arrangement which is intended for back-lighting of a display apparatus, the housing body is preferably designed to be specifically absorbent in its entirety for the entire visible spectral range. Inhomogeneous illumination resulting from phantom radiation can thus be reduced to a particularly major extent.

The major reduction in the scattered light component in general simplifies the beamshaping of the radiation which is generated in the optoelectronic component according to an emission characteristic which is predetermined, in particular directionally, for the lighting arrangement.

Figure 4:
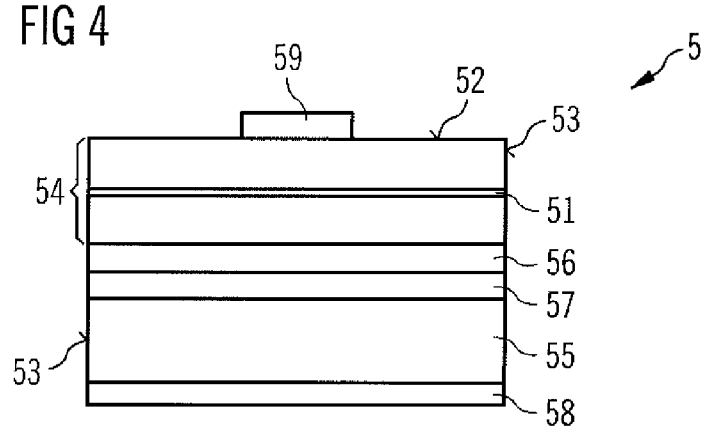
FIG. 4 shows a schematic section view of a semiconductor chip which is particularly suitable for a lighting arrangement according to the invention.

FIG. 4 shows a schematic sectional view of a exemplary embodiment of a semiconductor chip 5 which is particularly suitable for the optoelectronic component.

The semiconductor chip 5 comprises a semiconductor body 54 which is arranged on a carrier 55. The semiconductor body comprises a semiconductor layer sequence with an active area 51 which is provided for radiation production. The semiconductor layer sequence forms the semiconductor body 54. A first contact 58 is arranged on the side of the semiconductor body facing away from the carrier, via which first contact 58 the semiconductor chip can be electrically connected to a second contact 59, which is arranged on the side of the carrier facing away from the semiconductor body. The first contact 58 is provided in particular for electrically conductive connection to a bonding wire, and the second contact 59 is provided for electrically conductive connection to a connecting conductor. By way of example, the contacts may each contain a metal or an alloy.

In a preferred refinement, the semiconductor body 54, in particular the active area 51, contains at least one III-V semiconductor material, for example a material from the material systems $In_x Ga_y Al_{1-x-y}P$, $In_x Ga_y Al_{1-x-y}N$ or $In_x Ga_y Al_{1-x-y}As$, in each case with $0 \leq x \leq 1$, $0 \leq y \leq 1$ and $x+y \leq 1$, in particular with $x \neq 0$, $y \neq 0$, $x \neq 1$ and/or $y \neq 1$. The semiconductor layer sequence is preferably produced using a deposition process, in particular an epitaxial deposition process, for example by means of MBE or MOVPE on a growth substrate.

III-V semiconductor materials are particularly suitable for radiation production in the ultraviolet ($In_x Ga_y Al_{1-x-y}N$) through the visible ($In_x Ga_y Al_{1-x-y}N$, in particular for blue to green radiation, or $In_x Ga_y Al_{1-x-y}P$, in particular for yellow to red radiation) into the infrared ($In_x Ga_y Al_{1-x-y}As$) spectral range. Furthermore, III-V semiconductor materials, in particular from the stated material systems, can advantageously be used to achieve high internal quantum efficiencies for radiation production.

In a further preferred refinement, the active area 51 comprises a heterostructure, in particular a double-heterostructure. Furthermore, the active zone may comprise a single or a multiple quantum-well structure. Particularly high internal quantum efficiencies can be achieved by means of structures such as these, in particular a multiple quantum-well structure or a double-heterostructure.

For the purposes of the application, the expression quantum-well structure covers any structure in which charge carriers experience or can experience quantization of their energy states by confinement. In particular, the expression quantum-well structure does not include any details about the dimensionality of the quantization. It therefore covers, inter alia, quantum wells, quantum wires and quantum dots, and any combination of these structures.

In a further preferred refinement, a mirror layer 56 is arranged on the semiconductor body. The mirror layer is particularly preferably arranged between the semiconductor body 54 and the carrier 55. By way of example, the mirror layer may be in the form of a mirror layer containing metal, in particular an essentially metallic mirror layer. Radiation which is generated in the active area can be reflected on the mirror layer, thus preventing absorption in the structures, for example the carrier, which follow the mirror layer as seen from the active area. The efficiency of the semiconductor chip 5 can thus be increased. For example, the mirror layer contains Au, Al, Ag, Pd, Rh, Pt or an alloy with at least one of these materials. Al, Pd, Rh and Ag have particularly high reflectivity in the ultraviolet and blue spectral range, and Au has particularly high reflectivity in the yellow, orange and red into the infrared spectral range, as well. Furthermore, the reflection on the mirror layer increases the proportion of the radiation which emerges from the side of the semiconductor body opposite the mirror layer 56.

A connection layer 57, by means of which the semiconductor body is mounted on the carrier at the side of the mirror layer, can be arranged between the carrier 55 and the mirror layer 56. The connection layer 57 may, for example, be in the form of a solder layer.

The semiconductor chip shown in FIG. 4 is in the form of a thin-film semiconductor chip. In contrast to a conventional semiconductor chip, in the case of a thin-film semiconductor chip, the carrier is different from a growth substrate on which the semiconductor layer sequence of the semiconductor body is deposited, for example by means of epitaxy. The growth substrate can be removed or thinned in places or completely, mechanically and/or chemically. The carrier is used to make the semiconductor body mechanically robust.

In contrast to the growth substrate, the carrier advantageously need not comply with the stringent requirements relating to crystalline purity but can in fact be selected on the basis of other criteria, such as mechanical robustness, and thermal or electrical characteristics.

The carrier 55 preferably has a comparatively high thermal conductivity. For example, the carrier contains Ge. A carrier containing GaAs can also be used.

The active area 51 is preferably electrically conductively connected to the second contact 59 via the electrically conductive carrier, the electrically conductive connection layer and the electrically conductive mirror layer as well as the semiconductor layer sequence of the semiconductor body.

If the carrier contains a semiconductor material, then the carrier is preferably suitably doped to increase the conductivity.

By way of example, in order to produce a thin-film semiconductor chip, the semiconductor layer sequence of the semiconductor body 54 is first of all produced on the growth substrate. The semiconductor layer sequence forms the semiconductor body 54. The mirror layer 56 is then applied to the side of the prefabricated semiconductor body facing away from the growth substrate, for example by means of vapour deposition or sputtering. On the mirror layer side, the assembly with the semiconductor layer sequence and the growth substrate thereon is connected via the connection layer 57 to the carrier 55, following which the growth substrate is removed or detached, for example by means of etching or laser cutting.

A thin-film semiconductor chip, for example a thin-film light-emitting diode chip, can also be distinguished within the scope of the present invention by the following characteristic features:

a mirror layer is applied or is formed, for example integrated as a Bragg mirror in the semiconductor layer sequence, on a first main surface of a semiconductor body facing a carrier element, for example the carrier 55, which semiconductor body comprises a semiconductor layer sequence with an active area, in particular an epitaxial layer sequence, and the mirror layer reflects back at least a portion of the radiation which is generated in the semiconductor layer sequence back into it;

the semiconductor layer sequence has a thickness in the region of 20 µm or less, in particular in the region of 10 µm; and/or the semiconductor layer sequence contains at least one semiconductor layer with at least one surface which comprises a inter-mixing structure which, in the ideal case, leads to an approximately ergodic distribution of the light in the semiconductor layer sequence, that is to say it has a scattering behaviour which is as ergodically stochastic as possible.

A fundamental principle of a thin-film light-emitting diode chip is described by way of example in I. Schnitzer et al., Appl. Phys. Lett. 63 (16), 18 Oct. 1993, 2174-2176 the disclosure content of which is hereby incorporated by reference.

Thin-film semiconductor chips are distinguished, in particular with a mirror layer, by advantageously high efficiency. Furthermore, a thin-film semiconductor chip may have a cosinusoidal emission characteristic which corresponds essentially to that of a Lambert radiator. A semiconductor chip in the form of a surface radiator can be generated in a simplified manner by means of a thin-film semiconductor chip, in particular with a mirror layer containing metal or a metallic mirror layer.

The surface 52 of the semiconductor body facing away from the mirror layer is in the form of a main radiation output surface in the illustrated thin-film chip. A side surface 53 forms a secondary radiation outlet surface. The radiation power which emerges from the main radiation output surface is in this case greater than the radiation power which emerges from the secondary radiation outlet surface. In particular, the sum of the radiation power which emerges from the secondary radiation outlet surfaces is less than the radiation power which emerges through the main radiation output surface.

In thin-film semiconductor chips, the radiation power which emerges from the side secondary radiation outlet surfaces is decreased in favour of increased radiation power output from the main radiation output surface. Since the lighting arrangement 1 is preferably essentially intended to provide only the radiation which emerges from the surface 52 of the semiconductor chip, while radiation which emerges at the side is predominantly absorbed as described in conjunction with FIG. 3 by the element 3 which is formed like a reflector and is designed to be specifically absorbent, the radiation power emitted from the lighting arrangement 1 is thus advantageously increased. Thin-film semiconductor chips are therefore particularly suitable for use as a radiation source.

It should be noted that the lighting arrangement can, of course, be implemented not just by means of a thin-film semiconductor chip. A semiconductor chip in which the growth substrate is not detached may also be suitable for the lighting arrangement. A semiconductor chip such as this may be configured as shown in FIG. 4. In this case, the carrier 55 is formed by the growth substrate. There is then no need for the connection layer 57. The mirror layer 56 can be dispensed with or it may be in the form of a Bragg mirror, comprising a sequence of layers, for example as part of the semiconductor layer sequence of the semiconductor body 54.

Figure 5A:
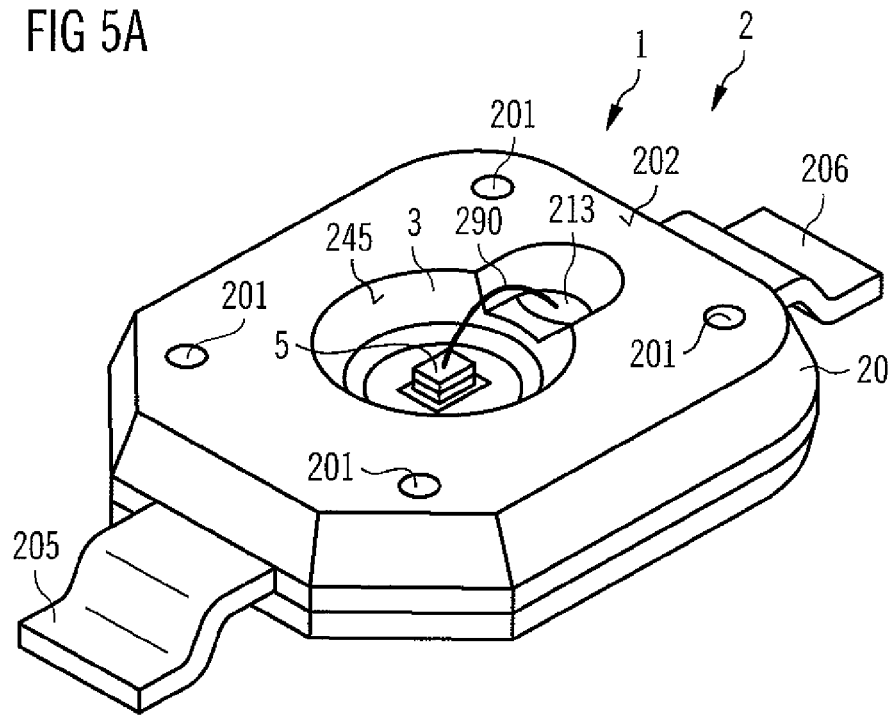
FIG. 5A shows a schematic perspective view of a lighting arrangement according to the invention.
Figure 5B:
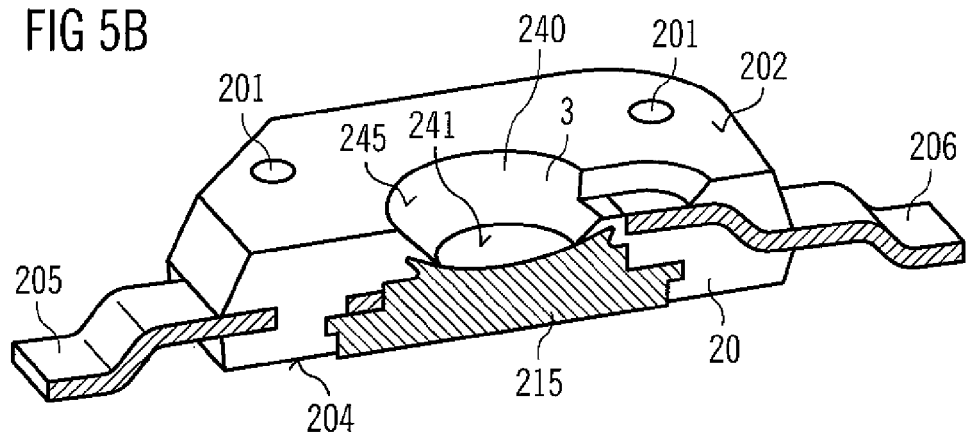
FIG. 5B shows a schematic section view through a lighting arrangement as shown in FIG. 5A, in the form of a perspective illustration.

A further exemplary embodiment of a lighting arrangement is shown in FIGS. 5A and 5B, with FIG. 5A illustrating a perspective view and FIG. 5B illustrating a perspective section view. As described in conjunction with FIGS. 1 and 2, the lighting arrangement 1 comprises an optoelectronic component 2 in which an element which is formed like a reflector is formed by a wall 245 of a cavity 240 of a housing body 20 and is designed to be specifically absorbent for radiation which is generated in the optoelectronic component. A thin-film semiconductor chip 5 is used as the radiation source.

The cavity 240 is in the form of a recess in a first main surface 202 of the housing body 20. A base 241 of the cavity preferably runs essentially parallel to the first main surface. The extent of the cavity on a plane which extends parallel to the first main surface preferably decreases, in particular continuously, as the distance from the first main surface increases, such that the base of the cavity has a smaller diameter than the diameter of the cavity on the plane of the first main surface. By way of example, the cavity may essentially be in the form of a truncated cone, whose diameter decreases as the distance from the first main surface increases.

Optics which are separate from the optoelectronic component can be attached to the optoelectronic component, for example by being plugged on or adhesively bonded on. This is not shown, for clarity reasons.

In contrast to the optoelectronic component shown in FIGS. 1 and 2, the optoelectronic component comprises a thermal connecting part 215 on which the semiconductor chip 5 is arranged. The thermal connecting part extends in the vertical direction preferably from the cavity 240 to a second main surface 204 of the housing body 20. The thermal connecting part simplifies thermal connection over a large area, in particular with respect to the chip mounting surface on the thermal connecting part, between the semiconductor chip 5 at the side of the second main surface and an external heat conducting apparatus, for example a heat sink, for example composed of Cu. Heat which is created during operation of the semiconductor chip can thus be efficiently dissipated from the optoelectronic component, thus advantageously increasing the efficiency and lengthening the life of the optoelectronic component, particularly when operated as a high-power component. The optoelectronic component may be designed to generate a high radiation power with advantageously better heat dissipation at the same time, because of the thermal connecting part. An optoelectronic component such as this is particularly suitable for illumination of surfaces, for example for back-lighting of a display apparatus, such as an LCD.

The thermal connecting part 215 is, for example, inserted or plugged into a lug of a first connecting conductor 205, or is connected in some other way to the first connecting conductor, in particular electrically conductively and/or mechanically, laterally circumferentially. Furthermore, the first main surface 202 of the housing body 20 comprises a recess 213 which is formed in the wall 245 of the cavity. This recess is provided for an electrically conductive connection of a second electrical connecting conductor 206 to the semiconductor chip 5, for example by means of the bonding wire 290. The second connecting conductor 206 is preferably raised above the chip mounting plane of the semiconductor chip 5 on the thermal connecting part 215. The thermal connecting part can also project at the side of the second main surface 204 out of the housing body or can end essentially on the same plane as the housing body. By way of example, the thermal connecting part contains a metal of high thermal conductivity, for example Cu or Al, or an alloy, for example a CuW alloy. A leadframe with a connecting part formed in this way and with a housing body is described in WO02/084749, the disclosure content of which is hereby incorporated by reference.

The optoelectronic component described in conjunction with FIGS. 5A and 5B may also, of course, be used as an optoelectronic component in the lighting arrangements shown in FIGS. 1 and 2.

FIGS. 6A and 6B show how the emission characteristic of a light arrangement according to the invention is advantageously modified in comparison to that of a lighting arrangement in which an element which is formed like a reflector is not designed to be specifically absorbent. The figure shows a first measurement (FIG. 6A) of the intensity I emitted in the visible spectral range, in arbitrary units, as a function of the angle θ with respect to the optical axis for a first lighting arrangement, and a second measurement (FIG. 6B) of the emitted intensity I in arbitrary units as a function of the angle θ with respect to the optical axis for a second lighting arrangement.

The second lighting arrangement is designed as described in conjunction with FIGS. 1 and 2. The first lighting arrangement is physically identical to the second lighting arrangement, with the element which is formed like a reflector not being designed to be specifically absorbent, however.

The housing body 20 of the first lighting arrangement is manufactured from high-reflectivity plastic, with reflectivities of about 85% being achieved for the surface of the housing body, and thus for the element which is formed like a reflector, by the addition of $TiO_2$ particles to the plastic compound. In contrast, in the case of the second lighting arrangement, the housing body and thus the element which is formed like a reflector are designed to be specifically absorbent in that the plastic compound from which the housing body is manufactured is coloured black by the addition of soot-like particles, as a result of which the reflectivity of the housing body in the visible spectral range is about 5%.

A curve 400 shows the profile of the intensity of the optical power emitted by the first lighting arrangement, as a function of the angle with respect to the optical axis. In this case, the intensity is normalized with respect to unity, and is thus shown as a relative intensity.

In a corresponding manner, a curve 450 shows the emission characteristic of the second lighting arrangement, with the intensity curve once again having been normalized.

Both the curve 400 and the curve 450 have a global maximum 410 and 460, respectively, of the intensity at an angle of about 67° to the optical axis. The described optical apparatus accordingly results in the radiation which is generated in the optoelectronic component not being emitted predominantly along the optical axis.

Since the first and the second lighting arrangements differ essentially only in the configuration of the element which is formed like a reflector, the radiation which emerges through the respective main radiation output surface 52 and strikes the radiation outlet surface directly experiences essentially the same beamshaping in both lighting arrangements. Differences between the emission characteristic of the first and of the second lighting arrangement therefore result predominantly from the radiation which in each case leaves the semiconductor chip through a side surface 53.

In the first lighting arrangement, the element 3 which is formed like a reflector is suitable, by virtue of its shape and arrangement relative to the semiconductor chip which generates radiation, for deflection onto the radiation outlet surface 41 of at least a portion of the radiation which strikes the element which is formed like a reflector. Because of the comparatively high reflectivity of about 85%, a considerable proportion of the radiation which emerges from the side surfaces 53 can therefore be deflected onto the radiation outlet surface 41 of the optical apparatus 4.

In the second lighting arrangement, the element which is formed like a reflector is in contrast designed to be specifically absorbent for the radiation which is generated in the semiconductor chip, as a result of which the element which is formed like a reflector deflects onto the radiation outlet surface only a considerably smaller proportion of the radiation which emerges from one of the side surfaces 53, because of the low reflectivity of about 5%, despite its shape and arrangement.

In the region of large angles with respect to the optical axis, for example between 45° and 90°, the two curves 400 and 450 have a very similar profile. Radiation which is emitted by the lighting arrangement in this angle range is predominantly that radiation component which has been emitted from the main radiation output surface of the respective semiconductor chip.

For smaller angles with respect to the optical axis, from 0° to about 45°, the relative intensity 400 of the radiation 420 which is emitted by the first lighting arrangement, in particular in the angle range from 0° to about 30°, is significantly higher than the relative intensity of the radiation which is emitted by the second lighting arrangement in the corresponding region 430. As described in conjunction with FIG. 3, this is caused by scattered radiation which is deflected onto the radiation outlet surface by the element which is formed like a reflector, and emerges therefrom predominantly at angles with respect to the optical axis 40 which are considerably less than 60°, for example 40° or less.

An emission characteristic with a maximum at angles of 60° or more, with an additional reduction at the same time in the radiation power emitted at small angles with respect to the optical axis 40, can accordingly be achieved better by the specifically absorbent version of the element which is formed like a reflector.

Figure 7A:
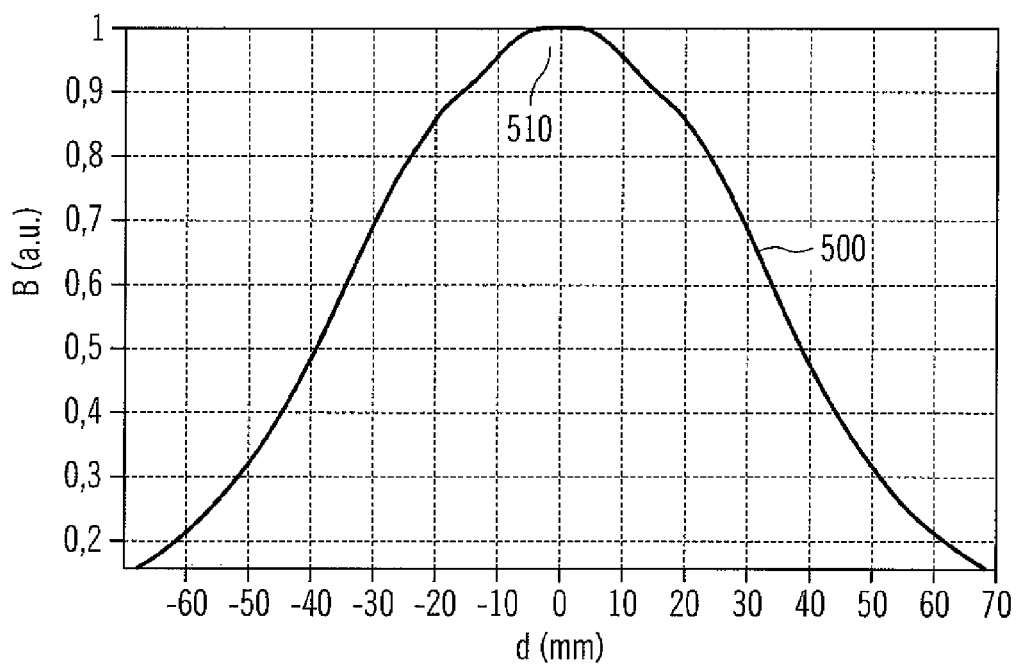
FIG. 7A shows an example of the relative illumination intensity B as a function of the distance d to the optical axis for a lighting arrangement having an element which is formed like a reflector and is designed not to be specifically absorbent.
Figure 7B:
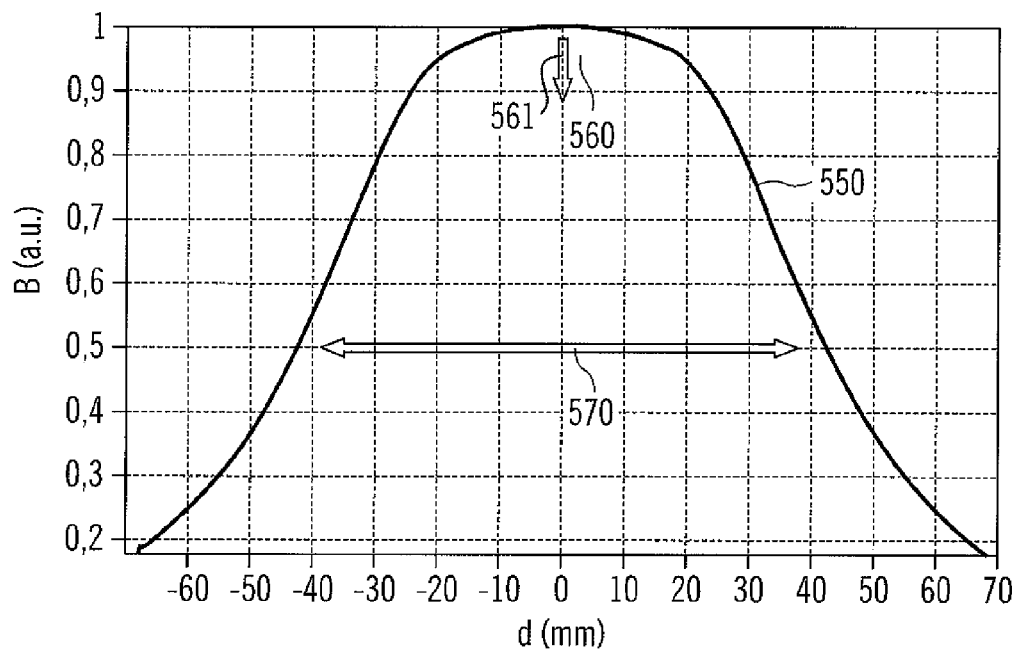
FIG. 7B shows an example of the relative illumination intensity B as a function of the distance d to the optical axis for a lighting arrangement according to the invention having an element which is formed like a reflector and is designed to be specifically absorbent.

The measurements of the illumination intensity distributions shown in FIGS. 7A and 7B were carried out on the same components as the measurements shown in FIGS. 6A and 6B. FIG. 7A and FIG. 7B respectively show the illumination intensity distribution for the first and the second lighting arrangement. Both the curve 500 for the first lighting arrangement and the curve 550 for the second lighting arrangement illustrate the illumination intensity B along a straight line which runs at the side of the radiation outlet surface 41 of the optical apparatus 4 at a distance of 25 mm over the surface of the semiconductor chip 5 at right angles to the optical axis 40. The distance d from the intersection of this straight line with the optical axis is plotted using a millimeter scale on the x-axis. The illumination intensity for both curves 500 and 550 is normalized with respect to the respective maximum value which both curves assume at the intersection with the optical axis, and is indicated on a relative scale, in undefined units.

Since the radiation outlet surface of the optical apparatus is rotationally symmetrical with respect to the optical axis, and the optical axis runs essentially through the centre of the semiconductor chip, the two illumination intensity distributions 500 and 550 are essentially symmetrical with respect to the y-axis.

In the region close to the y-axis, approximately for $|||d| \le 10$ mm, the profile 560 of the illumination intensity for the second lighting arrangement differs considerably from the profile 510 for the first lighting arrangement. While, in the case of the curve 500, the illumination intensity when d=10 mm has dropped by about 5% in comparison to the maximum value, the corresponding drop of the second curve is only about 1%.

In the first lighting arrangement, radiation which emerges from the side surfaces can be deflected onto the radiation outlet surface 41 by the element which is formed like a reflector and has high reflectivity. This radiation component strikes the radiation outlet surface at an angle which can be controlled only with difficulty, and can therefore be shaped by the optical apparatus 4 only with difficulty according to the emission characteristic predetermined for the lighting arrangement. The deflection takes place predominantly at comparatively small angles with respect to the optical axis, thus leading to a peak in the illumination intensity in the region 510. In contrast, in the second lighting arrangement, the element which is formed like a reflector is designed to be specifically absorbent, as a result of which radiation which emerges from the side surface 53 of the semiconductor chip is predominantly absorbed. The total radiation power provided by the optical apparatus can thus be formed in an improved manner according to a predetermined illumination intensity distribution. As indicated by an arrow 561, this results in the desired reduction in the illumination intensity in the region 560, and in a slower drop in the illumination intensity as the distance from the optical axis increases. For example, the drop in the relative illumination intensity at d=30 mm is about 0.32 for the curve 500, but only 0.22 for the curve 550.

A commonly used characteristic variable for the width of a distribution is the full width at half maximum, which indicates how broad the region around the maximum of the distribution is, in which the function value of the distribution is 50% or more of the maximum function value. This width is indicated by a horizontal arrow 570 in FIG. 6b. The full width at half maximum of the curve 550 is in contrast advantageously broadened in comparison to that of the curve 500 to about 84 mm in comparison to 76 mm for the curve 500.

The measurements shown in FIG. 7 illustrate that the illumination intensity distribution by means of an element which is formed like a reflector and is designed to be specifically absorbent can advantageously be significantly broadened. A surface which is considerably larger than the surface 52 of the semiconductor chip 5 can thus be illuminated particularly homogeneously. The described second lighting arrangement is therefore particularly suitable for back-lighting of display apparatuses such as LCDs. As a result of the large-area illumination with short distances between the surface to be illuminated and the lighting arrangement, the physical depth of the back-lighting unit can advantageously be kept small.

Furthermore, a lighting arrangement such as this can be used, for example, for general lighting, effect lighting, illumination of illuminated advertisement or for channel letters.

The invention is not restricted by the description on the basis of the exemplary embodiments. In fact, the invention covers every new feature and every combination of features, in particular including any combination of features in the patent claims, even if this feature or this combination is not itself explicitly mentioned in the patent claims or the exemplary embodiments.

The invention claimed is:

1. A lighting arrangement, comprising:
an optical apparatus with a radiation outlet surface; and
an optoelectronic component for producing radiation, wherein the optoelectronic component is a surface-mountable device (SMD) and comprises an element shaped like a reflector having a shape and arrangement adapted for deflecting radiation generated in the optoelectronic component through the radiation outlet surface, and being adapted to specifically absorb radiation which is generated in the optoelectronic component,
wherein the element, which is shaped like the reflector, is manufactured at least partly from black material or from a black material composition, or is provided at least partly with a black material or a black material composition.

2. The lighting arrangement according to claim 1, wherein the radiation outlet surface has a concave-curved subarea and a convex-curved subarea which at least partially surrounds the concave-curved subarea.

3. The lighting arrangement according to claim 2, wherein the optical apparatus has an optical axis, and the optical axis passes through the concave-curved subarea of the radiation outlet surface.

4. The lighting arrangement according to claim 3, wherein the radiation outlet surface is rotationally symmetrical with respect to the optical axis.

5. The lighting arrangement according to claim 1, wherein the optical apparatus is attached to the optoelectronic component.

6. The lighting arrangement according to claim 1, wherein the optoelectronic component comprises at least one semiconductor chip which is suitable for radiation production.

7. The lighting arrangement according to claim 6, wherein the semiconductor chip is formed as a thin-film semiconductor chip.

8. The lighting arrangement according to claim 7, wherein a surface of the semiconductor chip forms a main radiation output surface, and a side surface forms a secondary radiation outlet surface.

9. The lighting arrangement according to claim 1,
wherein the radiation outlet surface has a concave-curved subarea and a convex-curved subarea which at least partially surrounds the concave-curved subarea,
wherein the optical apparatus has an optical axis, and the optical axis passes through the concave-curved subarea of the radiation outlet surface,
wherein the radiation outlet surface is rotationally symmetrical with respect to the optical axis, and
wherein the optical axis passes through the semiconductor chip.

10. The lighting arrangement according to claim 6, wherein the minimum distance between the radiation outlet surface and the semiconductor chip is less than or equal to 5 mm.

11. The lighting arrangement according to claim 6, wherein the optical apparatus is adapted to form an emission characteristic which is predetermined for the lighting arrangement, with radiation which is output from the semiconductor chip being at least partially prevented from striking the radiation outlet surface after reflection within the lighting arrangement.

12. The lighting arrangement according to claim 1, wherein the element which is formed like the reflector is manufactured at least partly from a material which absorbs radiation that is generated in the optoelectronic component, or from an absorbent material composition, or is provided at least partly with a material which absorbs the radiation that is generated in the optoelectronic component, or with an absorbent material composition.

13. The lighting arrangement according to claim 1, wherein the reflectivity of the element which is formed like the reflector and is designed to be absorbent is less than or equal to 30%.

14. The lighting arrangement according to claim 7, wherein the semiconductor chip comprises a carrier and a semiconductor body, which comprises a semiconductor layer sequence with an active area which is intended to generate radiation, with the semiconductor body being arranged on the carrier and with the carrier being different from a growth substrate of the semiconductor layer sequence.

15. The lighting arrangement according to claim 14, wherein a mirror layer is arranged between the semiconductor body and the carrier.

16. The lighting arrangement according to claim 15, wherein the mirror layer contains a metal or is metallic.

17. The lighting arrangement according to claim 6, wherein the optoelectronic component comprises a housing body and an external electrical connecting conductor, with the housing body containing the element which is formed like the reflector, and with the semiconductor chip being mounted on the connecting conductor.

18. The lighting arrangement according to claim 17, wherein the element which is formed like the reflector is formed by means of a wall of a cavity in the housing body.

19. The lighting arrangement according to claim 18, wherein the semiconductor chip is arranged in the cavity in the housing body.

20. The lighting arrangement according to claim 17, wherein the housing body contains a ceramic.

21. The lighting arrangement according to claim 20, wherein the housing body is manufactured from a black ceramic, or the housing body is blackened.

22. The lighting arrangement according to claim 17, wherein the housing body contains a plastic.

23. The lighting arrangement according to claim 22, wherein the housing body is manufactured from black plastic or the housing body is blackened.

24. The lighting arrangement according to claim 1,
wherein the lighting arrangement is adapted for back-lighting of a display apparatus.

25. A lighting arrangement, comprising an optoelectronic component that is a surface-mountable device (SMD) having at least one semiconductor chip for radiation generation, which is formed as a thin-film semiconductor chip, and has a surface which is embodied as a main radiation output surface and a side surface which forms a secondary radiation outlet surface, the optoelectronic component comprising an element shaped like a reflector having a shape and arrangement that are suitable for deflecting at least a part of the radiation which emerges from the secondary radiation outlet surface, and with the element which is formed like the reflector being adapted to specifically absorb radiation which is emitted from the semiconductor chip,
wherein the element, which is shaped like the reflector, is manufactured at least partly from black material or from a black material composition, or is provided at least partly with a black material or a black material composition.

26. A lighting arrangement, comprising:
an optical apparatus with a radiation outlet surface; and
an optoelectronic component for producing radiation, wherein the optoelectronic component is a surface-mountable device (SMD) and comprises an element shaped like a reflector having a shape and arrangement adapted for deflecting radiation generated in the optoelectronic component through the radiation outlet surface, and being adapted to specifically absorb radiation which is generated in the optoelectronic component, wherein the optoelectronic component comprises at least one semiconductor chip which is adapted for radiation production, wherein the optoelectronic component comprises a housing body and an external electrical connecting conductor, with the housing body containing the element which is shaped like the reflector, and with the semiconductor chip being mounted on the electrical connecting conductor, and wherein the housing body contains a ceramic.

* * * * *